April 8, 1941. G. W. FYLER Re. 21,763
HIGH FREQUENCY CIRCUITS
Original Filed March 24, 1936
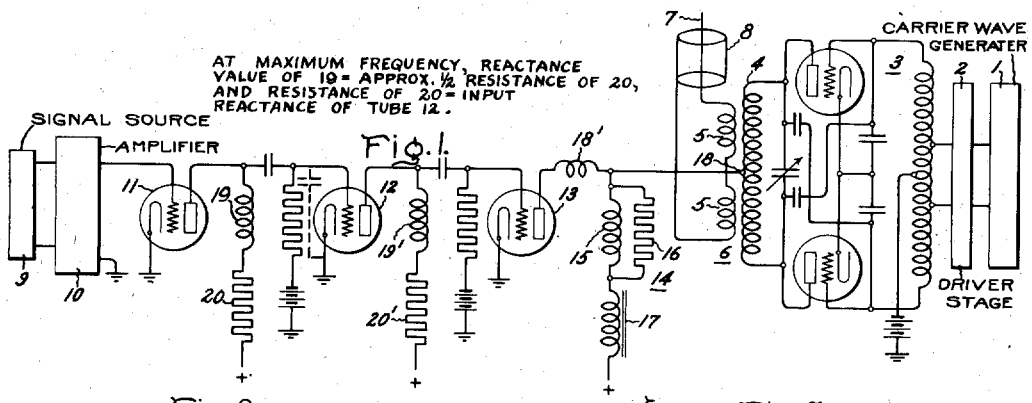
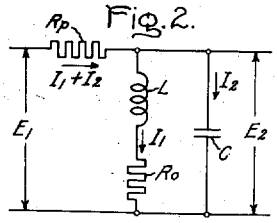
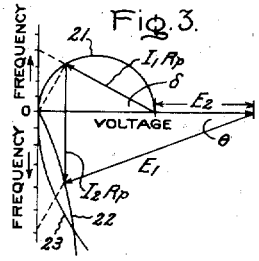
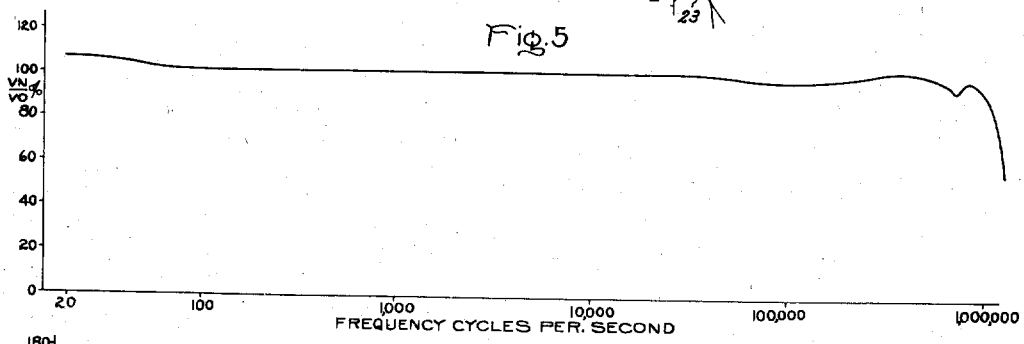
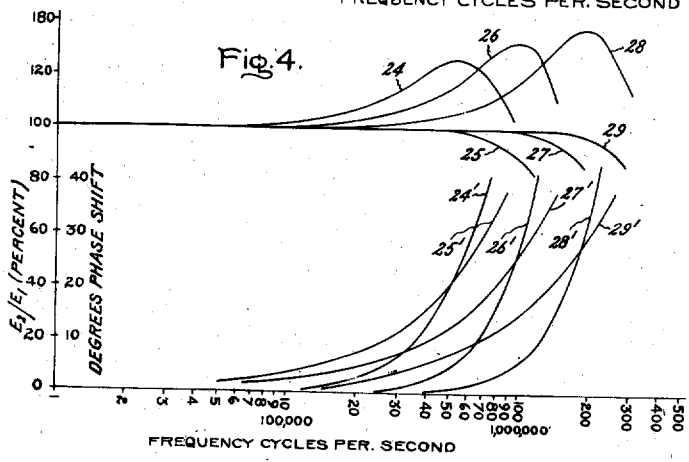
Inventor:
George W. Fyler,
by Harry E. Dunham
His Attorney.

Reissued Apr. 8, 1941

Re. 21,763

UNITED STATES PATENT OFFICE 21,763

HIGH FREQUENCY CIRCUITS

George W. Fyler, Stratford, Conn., assignor to General Electric Company, a corporation of New York Original No. 2,190,513, dated February 13, 1940, Serial No. 70,567, March 24, 1936. Application for reissue January 28, 1941, Serial No. 376,349

10 Claims. (Cl. 179—171)

My invention relates to high frequency circuits and more particularly to high frequency apparatus of the short wave high power type. Specifically my invention pertains to untuned amplifier systems adaptable for use in amplifying with a minimum of distortion signal currents having component frequencies extending over an exceedingly wide range, such for example as signal currents produced by a television signal source wherein the signal current frequency range extends from a low audio frequency to a high radio frequency.

It is an object of my invention to provide an improved amplifier system capable of amplifying signal currents having frequencies extending over an exceedingly wide range with substantially the same transmission efficiency for all frequencies within the range.

It is a further object of my invention to provide an amplifier capable of operating in the above manner in which uniform time delay for voltages of all frequencies within the operating range is produced in each amplifier stage.

In accordance with my invention I attain the above objects by providing an improved coupling impedance network between successive stages of a cascade-connected amplifier which gives a flat amplifier characteristic and a uniform time delay for all frequencies within the desired operating range. This network includes an inductance connected in series with a coupling resistance and having a value sufficient to equalize the amplification of frequencies within the upper portion of the signal current frequency range with the amplification of frequencies in the low portion of the frequency range. This value has been determined by calculation and experiments to be sufficient to produce at the highest frequency which it is desired to amplify an inductive reactance approximately equal to one-half the value of the coupling resistance, where the coupling resistance has a value equal to the input reactance into which the coupling impedance network operates.

The novel features which I believe to be characteristic of my invention are set forth with particularity in the appended claims. My invention itself, however, both as to its organization and method of operation together with further objects and advantages thereof will best be understood by reference to the following specification taken in connection with the accompanying drawing in which Fig. 1 illustrates a transmitting system having my invention embodied therein; Fig. 2 illustrates the equivalent circuit for a portion of the circuit shown in Fig. 1; Fig. 3 illustrates a graphical method of determining the correct impedance values for certain of the elements illustrated in Fig. 1; Figs. 4 and 5 illustrate certain characteristics of the operation of my invention.

Referring to Fig. 1 of the drawing, I have illustrated my invention as applied to a television transmitter of conventional design. As shown, the transmitter comprises a radio frequency carrier wave generator 1 connected to supply its output through a driver stage 2, a push-pull class C connected power amplifier system 3 and the windings 4 and 5 of a coupling transformer 6 to the conductors 7 and 8 of an antenna transmission line system.

The carrier wave output from the power amplifier is modulated in accordance with the signal oscillations produced by a signal current source 9. These signal oscillations are amplified by the cascade class A connected amplifiers 10, 11 and 12 and the constant current modulator amplifier stage 13 and are impressed on the output circuit of the power amplifier 3 through a modulator coupling impedance network 14. This network comprises an air core inductor 15 having a very low distributed capacity shunted by a resistance 16 and connected in series with an iron core reactor 17 having an inherently high distributed capacity. One terminal of the network 14 is tapped to the midpoint 18 of the winding 4 and the other terminal is connected to the positive side of a high voltage source (not shown) which is provided to supply energy to the respective anode circuits of the transmitter system.

In order to neutralize the effect of stray capacity in the carrier power amplifier on the modulator stage an inductance coil 18′ is provided which is connected in the modulator stage plate circuit in the manner illustrated. It will be understood that such stray capacity is caused by the distributed capacity of the coils 4 and 5 and also by the effect of the neutralizing condensers included in the power amplifier circuit. This stray capacity has been found to be small as compared to the distributed capacity of the reactor 17 and accordingly the value of inductance coil 18′ may be small.

The source of signal oscillations 9 may comprise a photo-electric cell system, a source of light, and a scanning disk employed in a television transmitter, all suitably arranged to scan the object to be televised with a spot of light. The signal current frequencies which are produced by this source and which are amplified and impressed on the plate circuit of the power amplifier 3 may cover an exceedingly wide frequency band which may extend from a low frequency of 20 cycles to a very high frequency of 1,000,000 cycles or more. If satisfactory operation of the transmitter is to be obtained all of the component frequencies within this range must be amplified by the same relative amount and impressed on the output circuit of the power amplifier 3 to produce the same relative degree of modulation. If certain of the frequencies are discriminated against, as for example, the frequencies in the high portion of the range, frequency distortion results which produces a blurred image or lack of definition when the signals are reproduced in a receiving system.

One problem involved in the construction of a transmitter suitable for the transmission of a carrier wave modulated in accordance with television signal currents is that of providing a coupling impedance network 14 between the constant current modulator stage 13 and the output circuit of the amplifier 3 which operates to impress the signal voltages upon the output circuit without attenuation of the high frequency components of the impressed voltages. This problem, together with the solution thereof, is completely described in my Patent No. 2,147,486, issued February 14, 1939.

Briefly, equalized amplification by the modulation stage 13 of all of the components in the side-band frequency range is obtained in accordance with the invention described in the aforementioned patent by providing the parallel connected inductance 15 and resistance 16 connected in series with the iron core reactor 17 across the signal channel and in the anode circuit of the modulator stage 13. The constants of this coupling network are so selected that the overall impedance between the terminals thereof is maintained above a predetermined value for currents of all frequencies within the wide frequency range.

Another problem involved in the construction of an amplifying system capable of amplifying without substantial distortion of frequency components of the signal voltages is that of obtaining a coupling impedance network between the successive intermediate amplifier stages which is capable of impressing the output voltage of one amplifier stage on the input circuit of the succeeding amplifier stage with equalized transmission efficiency for all frequency components contained in the signal voltages.

In accordance with my invention such equalized transmission efficiency is obtained by providing in series with each of the coupling resistances 20, 20′, etc., inductances 19, 19′, etc., and so proportioning the impedance constants of these elements with respect to the input impedance of the amplifier into which the coupling network operates that attenuation of frequencies in the upper portion of the frequency range is substantially eliminated.

The effect of the inductance 19 in the coupling circuit will more readily be understood by reference to Fig. 2 wherein the equivalent circuit included between the amplifiers 11 and 12 is illustrated. This equivalent circuit includes a source of electromotive force $E_1$ which of course corresponds to the electromotive force generated in the anode circuit of the amplifier 11. The source of electromotive forces $E_1$ may be considered as connected in a circuit including a resistance $R_p$ which is the internal static resistance of the anode circuit of the discharge device 11 and a condenser C. The circuit also includes an inductance L and resistance $R_0$ connected in series across the terminals of the condenser C. The resistance $R_0$ includes the coupling resistance between the grid and cathode of the discharge device 12 and comprises the resistance 20 and the non-inductive resistance of the inductance coil 19. The inductance L of course comprises the inductance of the coil 19. The capacitance C is the capacitance between the grid and cathode of the discharge device 12 and that included in the circuit connections to these electrodes. The instantaneous current flowing in the branch circuit including the resistance $R_0$ may be represented by the reference character $I_1$ and the instantaneous current flowing in the branch circuit including the capacitance C may be indicated by the reference character $I_2$. Obviously the instantaneous current traversing the resistance $R_p$ is equal to the vector sum of $I_1$ and $I_2$.

The value of $R_0$ and of the inductance L necessary to provide a constant ratio of $E_1/E_2$ for equalized amplification at all frequencies within the desired operating frequency range, may be determined by the graphical method illustrated in Fig. 3 from which the curves of Fig. 4 are derived.

In Fig. 3, $E_2$ is drawn to scale along a horizontal axis in the manner illustrated. This voltage is assumed to be constant in determining the relation between $E_1$ and $E_2$ at any desired frequency. With voltage $E_2$ fixed in magnitude and direction, it is necessary to obtain the vector sum of $I_1R_p$ and $I_2R_p$ at any frequency in order to determine the value of $E_1$. Since $E_2$ is constant and is the voltage across the series circuit L and $R_0$ at all frequencies, the locus of the vector $I_1R_p$ as the frequency is varied from zero to infinity is the semi-circle 21. Further, the tangent of the angle $\delta$ between the vector $I_1R_p$ and the horizontal reference axis is proportional to frequency. By a trigonometric calculation it may be determined that the distance from 0 to the intersection of the projection of the vector $I_1R_p$ with the vertical reference axis is directly proportional to tangent $\delta$. Hence it will be seen that the linear scale marked along the vertical axis from 0 upward may directly be calibrated to read frequency.

Since the circuit through which $I_2$ flows is comprised of pure capacitance only, this current is directly proportional to frequency. Hence the linear scale may extend downwardly from 0 and being proportional to frequency will also be proportional to the vector $I_2R_p$, it being understood that this vector is in leading quadrature phase relation to the voltage vector $E_2$.

With the three vectors $E_2$, $I_1R_p$ and $I_2R_p$ thus determined in phase and magnitude for any given frequency the voltage $E_1$ at that frequency is of course the vector sum of the three vectors. The angle $\theta$ between the vectors $E_1$ and $E_2$ corresponds to the phase shift between the voltages $E_2$ and $E_1$ for the frequency being considered. For any given combination of circuit constants the locus of the vector $E_1$ may be determined by drawing downward from the semi-circle 21 voltage vectors of proper magnitude to be proportional to the selected frequencies corresponding to the points selected on the semi-circle 21. Such a locus may be as shown by the curve 22. The locus of $E_1$ vectors corresponding to a constant value of $E_1/E_2$ is of course an arc as indicated at 23 having a center at the right end of the vector $E_2$ and a radius equal to the sum of the vector $E_2$ and the diameter of the semi-circle 21.

With the above pictorial representation of the voltage relation between the source voltage $E_1$ and the input voltage $E_2$ fixed for a given set of circuit constants the transmission efficiency, or $E_2/E_1$, for any frequency may be determined, and curves illustrating the relation between $E_2/E_1$ and frequency may be drawn. Such curves, illustrating the relation between $E_1$, $E_2$ and frequency for different combinations of circuit constants, are shown in Fig. 4 by the curves 24 to 29 inclusive. Phase shift curves corresponding to the circuit constants which give the transmission efficiency curves 24 to 29 inclusive, are illustrated at 24' to 29' inclusive. In this figure the curves 24 to 29 inclusive show the transmission efficiencies for the circuit constants given in the following table and the curves 24' to 29' inclusive show the corresponding phase shift between these voltage vectors as a function of frequency:

| Curve | $R_0$ ohms | L Microhenries | $\omega L$ |
|---|---|---|---|
| 24 and 24' | 2000 | 640 | 2010 at 500,000 cycles. |
| 25 and 25' | 2000 | 240 | 750 at 500,000 cycles. |
| 26 and 26' | 1000 | 160 | 1000 at 1,000,000 cycles. |
| 27 and 27' | 1000 | 67 | 420 at 1,000,000 cycles. |
| 28 and 28' | 500 | 40 | 500 at 2,000,000 cycles. |
| 29 and 29' | 500 | 16.7 | 210 at 2,000,000 cycles. |

| Curve | C Microfarads | $\frac{1}{\omega C}$ |
|---|---|---|
| 24 and 24' | 160 | 2000 at 500,000 cycles. |
| 25 and 25' | 160 | 2000 at 500,000 cycles. |
| 26 and 26' | 160 | 1000 at 1,000,000 cycles. |
| 27 and 27' | 160 | 1000 at 1,000,000 cycles. |
| 28 and 28' | 160 | 500 at 2,000,000 cycles. |
| 29 and 29' | 160 | 500 at 2,000,000 cycles. |

Each of the curves shown in Fig. 4 was determined by the graphical method illustrated in Fig. 3 and these curves were found to check approximately with corroborating tests conducted on circuits containing these constants. Unpredictable stray capacities of the circuits, and the change of impedance of resistances with frequency, tend to prevent accurate checking of calculations and test results.

By reference to the curves of Fig. 4 it will be observed that to obtain flat equalization over the desired frequency range it is necessary that the resistance $R_0$ should be approximately equal to the capacitive reactance between the input electrodes of the discharge device into which the coupling impedance network operates at the highest frequency to be amplified, if equalized amplification over the entire frequency range is to be obtained. It will further be seen that the inductance L must be of such value that the reactance thereof at the highest frequency to be amplified is equal approximately to one-half the value of the resistance $R_0$ which is connected in series therewith.

Thus, consider the curves 24 and 25 by way of example, where the desired frequency range extends to a value of approximately 500,000 cycles per second. At this frequency the capacitive reactance of the condenser C is equal approximately to 2000 ohms. With 640 microhenries an inductance value for the inductance coil 19 the reactance thereof is equal approximately to 2010 ohms. It will be observed that with this value of inductive reactance a decided hump is produced in the voltage ratio curve in the upper portion of the frequency range as shown in curve 24. However, if the inductance value of the element 19 be selected to be 240 microhenries corresponding to an inductive reactance of 750 ohms at a frequency of 500,000 cycles per second equalized amplification is obtained, as shown in curve 25, over the entire frequency range extending to the desired value of 500,000 cycles per second.

Contrasting curve 25 with curve 27 it will be seen that the latter curve shows that equalized amplification is obtained over a frequency range extending to 1,000,000 cycles per second. At this frequency the capacitive reactance of C is approximately 1000 ohms. From the above table of circuit constants the values of resistance $R_0$ and L necessary to produce this curve are given as 1000 ohms and 67 microhenries respectively. Thus the resistance $R_0$ is approximately equal to the capacitive reactance of C at this upper limit of frequency and the inductive reactance of L is 420 ohms or a value approximately equal to one-half the value of the coupling resistance $R_0$.

As is noted above the curves 24' to 29' illustrate the phase shift between voltages $E_1$ and $E_2$ as a function of frequency. It will of course be understood that phase shift angles may be converted into time delay intervals representing the time lag between the voltage $E_1$ and $E_2$ at selected frequencies within this operating range. For uniform time delay, the phase shift should be proportional to frequency.

It will further be understood that if phase distortion is to be prevented this time delay should be the same for all frequencies within the operating frequency range. If the values of phase shift as given by the curves 25', 27', or 29' for flat or uniform response for any frequency be converted into time delay, it will be found that this time delay is constant for all frequencies within the selected operating range covered by the curves. Uniform time delay over a wide band of frequencies in the picture frequency amplifier of a television transmitter does not cause distortion of the transmitted picture signals for purposes of reproduction, but simply delays the entire picture. I have found experimentally and mathematically calculated that flat equalization of the response characteristic, illustrated for example in curves 25, 27 and 29 of Fig. 4, utilizing the circuits described herein and the relationship given for the circuit elements and the input capacity of the succeeding amplifier, is accompanied by uniform time delay, illustrated by the phase shift curves 25', 27' and 29' of Fig. 4. In a six-stage amplifier having a flat response over a range extending from 20 to 1,000,000 cycles, the phase shift has been found to correspond to a time delay of .53 microsecond.

To further emphasize the importance of selecting the circuit constants of the coupling network to conform to the principles described above, reference may be had to Fig. 5 wherein the amplification characteristics of the signal amplifier system included in the transmitter shown in Fig. 1 is illustrated. It will be seen that substantially uniform amplification is obtained for all frequencies extending from 20 cycles to 1,000,000 cycles.

While I have shown a particular embodiment of my invention, it will of course be understood that I do not wish to be limited thereto since many modifications in the circuit may be made, and I contemplate by the appended claims to cover all such modifications as fall within the true spirit and scope of my invention.

What I claim as new and desire to secure by Letters Patent of the United States, is:

1. In combination, an electron discharge amplifier having input electrodes comprising a cathode and control grid, a source of oscillations having component frequencies extending over a wide range, and an impedance network for impressing said oscillations on said input electrodes including a series connected resistance and inductance connected across said source and in shunt to the input capacity of said amplifier, said resistance having a value substantially equal to the input reactance of said amplifier at the highest frequency in said range and said inductance having a reactance value at the highest frequency in said range equal approximately to one-half the value of said resistance, whereby substantially equal transmission efficiency is obtained for all of said component frequencies.

2. In combination, an electron discharge amplifier having input electrodes comprising a cathode and a control grid, a source of oscillations having component frequencies extending over a wide range, and a coupling impedance network for impressing said oscillations on said input electrodes, said network including a resistance having a value equal to the reactance between said input electrodes at the highest frequency in said range and an inductance connected in series with said resistance, said inductance and resistance being in shunt to the input capacity of said amplifier, said inductance having a reactance value at the highest frequency in said range equal approximately to one-half the value of said resistance.

3. In combination, an electron discharge amplifier having input electrodes comprising a cathode and a control grid, a source of oscillations having component frequencies extending over a range from a low audio frequency to a high radio frequency, and an impedance network for impressing said oscillations on said input electrodes including a series connected resistance and inductance connected across said source and in shunt to the input capacity of said amplifier, said resistance having a value equal to the reactance between said input electrodes at the highest frequency in said range and said inductance having a reactance value at said highest frequency equal approximately to one-half the value of said resistance.

4. In a system for amplifying currents having frequencies extending over a wide range and comprising a plurality of cascade-connected amplifiers, a coupling impedance network for impressing said currents from one of said amplifiers on the next succeeding amplifier including a resistance having a value approximately equal to the input reactance of the succeeding stage at the highest frequency to be amplified, and means for equalizing the amplification of currents of all frequencies within said range, said last-named means including an inductance connected in series with said resistance, said inductance and resistance being connected in shunt to the input capacity of said next succeeding amplifier, said inductance having a reactance value at the highest frequency to be amplified equal approximately to one-half the resistance value of said resistance.

5. In combination, an electron discharge amplifier having input electrodes comprising a cathode and a control grid, a source of oscillations having component frequencies extending over a wide range, and a coupling impedance network for impressing said oscillations on said input electrodes comprising inductance and resistance connected in series with each other across said source and in shunt to the input capacity of said amplifier, said resistance having a value substantially equal to the input reactance of said amplifier at the highest frequency in said range and said inductance having a reactance value at the highest frequency in said range equal approximately to one-half the value of said resistance, whereby uniform time delay for transmission through said network of currents having any frequency in said range is produced.

6. In combination, a source of oscillations having component frequencies extending over a wide range, a circuit including said source and a total circuit capacity, and an impedance network connected in parallel with said capacity, said network including a series connected resistance and inductance, said resistance having a value approximately equal to the reactance of said capacity at the highest frequency in said range and said inductance having a reactance value at said highest frequency equal approximately to one-half the value of said resistance.

7. In combination, a source of oscillations having component frequencies extending over a wide range, a circuit including said source and a substantially pure capacity reactance, and a branch series circuit including said source and a series connected resistance and inductance connected across said source and in shunt to said capacity reactance, said inductance and resistance constituting an impedance network for impressing said oscillations on said capacity reactance, said resistance having a value equal to said capacity reactance at the highest frequency in said range and said inductance having a reactance value at said highest value equal approximately to one-half the value of said resistance.

8. In combination, a source of oscillations having component frequencies extending over a wide range, a circuit including a total input capacity reactance, and a coupling impedance network for impressing said oscillations on said capacity reactance including a resistance having a value approximately equal to said capacity reactance at the highest frequency to be transmitted and an inductance connected in series with said resistance, said inductance and resistance being connected in shunt to said capacity reactance, said inductance having a reactance value at the highest frequency to be transmitted equal approximately to one-half the value of said resistance.

9. In combination, a source of oscillations including an electron discharge amplifier, said oscillations having component frequencies extending over a wide range, a circuit including a total input capacity, a coupling impedance network for impressing said oscillations from said amplifier on said capacity including a resistance having a value approximately equal to the reactance of said capacity at the highest frequency to be amplified, and means for equalizing the amplification of currents of all frequencies within said range, said last-named means including an inductance connected in series with said resistance, said inductance and resistance being connected in shunt to said capacity, said inductance having a reactance value at the highest frequency to be amplified equal approximately to one-half the value of said resistance.

10. In combination, a source of oscillations extending over a wide frequency band, said source having an internal regulation impedance, a pair of output terminals, means for connecting said oscillation source to said terminals, a succeeding utilization circuit, means for connecting said utilization circuit to said terminals, the group of elements comprising said oscillation source, said connection means, and said utilization circuit including a total capacity in shunt with said terminals, and a coupling impedance network connected in shunt with said terminals, said network being constituted by a resistance having a value approximately equal to the total effective reactance of said capacity at the highest frequency in said band and an inductance connected in series with said resistance, the reactance of said inductance at said highest frequency having a value equal approximately to one-half the value of said resistance.

GEORGE W. FYLER.